United States Patent
D'Evelyn et al.

(10) Patent No.: US 6,936,488 B2
(45) Date of Patent: Aug. 30, 2005

(54) HOMOEPITAXIAL GALLIUM-NITRIDE-BASED LIGHT EMITTING DEVICE AND METHOD FOR PRODUCING

(75) Inventors: Mark P. D'Evelyn, Niskayuna, NY (US); Nicole A. Evers, Schenectady, NY (US)

(73) Assignee: General Electric Company, Schenectady, NY (US)

(*) Notice: Subject to any disclaimer, the term of this patent is extended or adjusted under 35 U.S.C. 154(b) by 29 days.

(21) Appl. No.: 10/440,574

(22) Filed: May 19, 2003

(65) Prior Publication Data

US 2004/0031978 A1 Feb. 19, 2004

Related U.S. Application Data

(62) Division of application No. 09/694,690, filed on Oct. 23, 2000, now abandoned.

(51) Int. Cl.[7] ............................................. H01L 21/00
(52) U.S. Cl. ............................. 438/22; 438/24; 438/36; 438/46; 438/47
(58) Field of Search ...................... 257/79–103; 438/22, 438/24, 36, 46, 47

(56) References Cited

U.S. PATENT DOCUMENTS

| | | | | |
|---|---|---|---|---|
| 5,981,980 A | * | 11/1999 | Miyajima et al. | ............ 257/103 |
| 6,316,785 B1 | * | 11/2001 | Nunoue et al. | ............... 257/14 |
| 6,362,496 B1 | * | 3/2002 | Nanishi et al. | ................ 257/94 |

* cited by examiner

*Primary Examiner*—Long Pham
*Assistant Examiner*—Wai-Sing Louie
(74) *Attorney, Agent, or Firm*—Fay, Sharpe, Fagan, Minnich & McKee, LLP

(57) ABSTRACT

A light emitting device comprised of a light emitting semiconductor active region disposed on a substrate comprised of GaN having a dislocation density less than $10^5$ per $cm^2$ is provided.

33 Claims, 1 Drawing Sheet

HOMOEPITAXIAL GALLIUM-NITRIDE-BASED LIGHT EMITTING DEVICE AND METHOD FOR PRODUCING

This application is a divisional of U.S. Ser. No. 09/694,690 filed Oct. 23, 2000, now abandoned.

BACKGROUND OF THE INVENTION

The present invention relates to lighting applications, more specifically to light emitting diode (LED) and laser diode (LD) applications. More specifically, the present invention relates to a homoepitaxial LED or LD structure and a method for making such a structure.

During the past decade there has been tremendous interest in gallium nitride (GaN) based optoelectronic devices, including light emitting diodes and laser diodes. Because high-quality GaN substrates have not been available, virtually all of the art has involved heteroepitaxial deposition of GaN and GaInAlN on sapphire or SiC substrates. A thin low-temperature buffer layer, typically AlN or GaN, is used in order to accommodate the lattice mismatch between GaN and the substrate and maintain an epitaxial relationship to the substrate.

The use of sapphire substrates with a buffer layer has a number of important limitations for manufacture of LEDs. Sapphire is an electrical insulator, forcing electrical contacts to be made above and to the side of the device structure, rather than above and below (a so-called vertical device structure), wasting space on the wafer. In addition, sapphire has a rather poor thermal conductivity, limiting heat dissipation. Sapphire has a large (16%) lattice mismatch with respect to GaN, so that even with the use of buffer layers a very high level of threading dislocations ($10^7$–$10^{11}$ cm$^{-2}$) are generated within the device structure. These dislocations may limit performance in certain applications. Deposition of the buffer layer also adds cost and complexity to the process. Sapphire also has a large (45%) mismatch in the thermal expansion coefficient with respect to GaN, which generates stresses in device structures upon cooldown from the processing temperature and limits the maximum size of wafers that can be used without forming cracks. Facets must be prepared at the ends of laser diode structures in order to define the laser cavity, and the difficulty in cleaving c-axis-oriented sapphire makes facet preparation more expensive.

The use of SiC substrates alleviates some of these limitations but introduces other problems. The lattice mismatch to GaN is smaller than that of sapphire, but very high defect concentrations are still generated, and the use of buffer films is still needed. SiC is also much more expensive than sapphire. Lower cost SiC is typically opaque, decreasing the efficiency of the LED device because light emitted from the active region toward the substrate would be absorbed rather than transmitted. Since some applications of LEDs involve emission of ultraviolet light; this light could be absorbed by even a high-quality, transparent SiC substrate because the bandgap is less than that of sapphire or GaN. Moreover, LEDs fabricated on SiC do not generally perform as well as LEDs fabricated on sapphire.

A high-quality GaN substrate would reduce these problems. The substrate could be made electrically conductive as well as semi-insulating, so vertical LED or LD structures could be fabricated. The thermal conductivity of pure GaN is five times that of sapphire, improving heat dissipation, enabling higher power levels, and improving lifetime. Also, there would be no thermal expansion mismatch, resulting in ease of scalability to larger substrates, which would reduce cost. The concentration of threading dislocations would be reduced by 3–10 orders of magnitude, which would reduce leakage currents, improve device yields, and the consistency of I-V characteristics, increase device lifetimes, particularly at high power levels, and may also improve emission efficiency and resistance to static discharge. Furthermore, GaN is much easier to cleave than sapphire, and LD facets can be prepared by simple cleavage rather than by reactive ion etching, further reducing costs.

Some limited work has previously been carried out on forming homoepitaxial LED or LD devices on GaN substrates. Writing in the Journal of Crystal Growth, Pelzmann, et al. reported that homoepitaxial homojunction GaN LED devices demonstrated a doubling of the emission intensity relative to the analogous device on a sapphire substrate. However, homojunction GaN LEDs have much lower emission intensities than InGaN/GaN heterojunction LEDs, as is well known in the art. Therefore, the devices demonstrated by Pelzmann, et al. do not offer any performance advantages relative to conventional heteroepitaxial LEDs.

U.S. Pat. No. 5,637,531 teaches a method for the formation of a GaN crystal which could have applications for homoepitaxial LED formation. This crystal is actually a multi-layer crystal, the fabrication of which requires multiple steps. In addition, U.S. Pat. Nos. 5,770,887 and 5,810,925 to Tadatomo, et al., teach the growth of double-heterostructure LEDs on GaN pseudo-substrates. These pseudo-substrates comprise GaN/ZnO multilayers rather than GaN single crystals. The ZnO served as buffer layers throughout the crystal growth process, and the process therefore required extra steps for the formation and later removal of the ZnO layers.

Kamp, et al. have developed a method for the formation of GaN crystals with homoepitaxial growth thereon. This work, reported in the MRS Internet Journal of Nitride Semiconductor Research, focuses on the application of chemically assisted ion beam etching as a method for polishing the GaN crystal prior to LED formation. The homoepitaxial GaN-based LEDs described by Kamp et al. suffer from a number of important limitations that are overcome by the present invention. The single-crystal GaN substrates were grown in molten Ga with a $N_2$ overpressure of 10–20 kbar at a temperature below 1600° C. The undoped GaN crystals grown by this method have a high concentration of n-type defects, ca. $5\times10^{19}$ cm$^{-3}$, believed to comprise oxygen impurities and nitrogen vacancies. As a consequence, the crystals are relatively opaque, with an absorption coefficient of about 200 cm$^{-1}$ at wavelengths in the visible portion of the spectrum, and up to half the light emitted by the LED is absorbed by the substrate. This constitutes a large disadvantage compared to conventional heteroepitaxial LEDs fabricated on sapphire or transparent SiC substrates. In addition, the substrates employed by Kamp et al. have a dislocation density of approximately $10^3$ to $10^5$ cm$^{-2}$. This value is lower than the corresponding values in heteroepitaxial LEDs of approximately $10^7$ to $10^{10}$ cm$^{-2}$. Further, the high concentration of n-type defects in undoped crystals grown in molten Ga causes the lattice constant to increase by about 0.01–0.02%, which generates strain in undoped epitaxial GaN layers deposited thereupon. Additionally, the undoped GaN substrates employed by Kamp et al. have a rather limited carrier mobility, about 30–90 cm$^2$ V-s, which may be limiting in high-power devices.

Porowski, et. al., writing in Acta Physica Polonica A, disclosed a method for growing transparent GaN crystals involving the addition of 0.1–0.5% magnesium to a gallium growth medium at temperatures of 1400–1700° C. and nitrogen pressures of 10–20 kbar. This method is capable of producing GaN crystals with an optical absorption coefficient below 100 cm$^{-1}$. However, these crystals have an electrical resistivity of $10^4$–$10^6$ Ω-cm at room temperature, rendering them unsuitable as substrates for vertical light-emitting structures of one type described in the present invention.

It would therefore be desirable to develop a method for forming a high quality GaN substrate, on which to form homoepitaxial LED devices, which would eliminate the above-mentioned problems.

SUMMARY OF THE INVENTION

In an exemplary embodiment of the present invention, a light emitting device comprised of a light emitting semiconductor active region disposed on a substrate comprised of GaN having a dislocation density less than $10^5$ per cm$^2$, more preferably below $10^3$ per cm$^2$, is provided.

In a further exemplary embodiment of the present invention, a method for the preparation of a light emitting device comprising disposing a group III semiconductor active region on a substrate comprised of GaN in the absence of buffer layers is described.

In yet another exemplary embodiment of the present invention, a homoepitaxial light emitting diode is provided. The homoepitaxial light emitting diode is comprised of a n-electrode, a n-GaN substrate, a n-GaN or n-Al$_w$Ga$_{1-w}$N cladding layer, an In$_x$Ga$_{(1-x)}$N active layer, a p-Al$_y$Ga$_{(1-y)}$N cladding layer, a p-GaN cladding layer, and a p-electrode, wherein $0 \leq w,x,y \leq 1$.

In an additional exemplary embodiment of the present invention, a homoepitaxial laser diode is comprised of a n-electrode, a n-GaN substrate, a n-Al$_w$Ga$_{1-w}$N cladding layer, a n-GaN cladding layer, a In$_x$Ga$_{1-x}$N/In$_y$Ga$_{1-y}$N multiple quantum well, a p-Al$_z$Ga$_{1-z}$N cladding layer, a p-GaN cladding layer, a p-Al$_y$Ga$_{1-y}$N cladding layer, a p-GaN cladding layer, and a p-electrode, wherein $0 \leq v,w,x,y,z \leq 1$. Parallel facets are then provided in a direction perpendicular to the deposited layers.

DETAILED DESCRIPTION OF THE INVENTION

Figure 1:
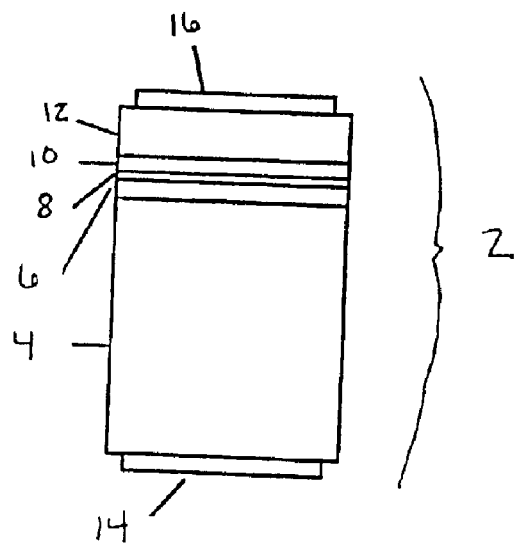
FIG. 1 is a detailed schematic illustration of the structure of a homoepitaxial light emitting diode device representative of the present invention.

The present invention describes a homoepitaxial light emitting device and a method for forming that device. The present inventive device is a GaN based LED or LD grown on a GaN substrate. The GaN substrate for the device fabrication consists of an (0001)-oriented GaN wafer cut from a boule that was grown using a supercritical solvent at a temperature greater than about 550° C. and a pressure greater than about 5 kbar.

More specifically, one suitable process for forming the GaN substrate comprises providing a source gallium nitride, solvent, and mineralizer. The source gallium nitride may comprise at least one of poorly-crystallized gallium nitride, well-crystallized gallium nitride, amorphous gallium nitride, polycrystalline gallium nitride, and combinations thereof. The source gallium nitride may be provided "as-is" in its raw form. Alternatively, the source gallium nitride can be compacted into a "pill" and/or sintered into a polycrystalline compact. Alternatively, the source gallium nitride can be formed in situ. Gallium metal may be provided, which then reacts with the ammonia solvent after sealing of the capsule and treatment at high pressure and high temperature to form source gallium nitride.

The source gallium nitride may then be combined with at least one of the mineralizer and solvent to form a mixture. The gallium nitride, solvent, and mineralizer may optionally be provided individually to the capsule as separate and distinct uncombined materials. The mixture, which can comprise gallium nitride and at least one of the solvent and mineralizer, can be optionally compacted into a pill, however the compacting of the mixture need not be conducted in the gallium nitride growth process.

The source gallium nitride, solvent, and mineralizer, whether as a mixture that is compacted or not compacted, are then placed inside a capsule. Optionally, additional mineralizer can also be added to the capsule. The capsule, which will be described hereinafter, can then be filled with a nitrogen-containing solvent, for example at least one of ammonia or hydrazine, or an organic solvent, including but not limited to, methylamine, melamine, or ethylene diamine, and mixtures thereof The capsule is then sealed, disposed in a pressure cell, and subjected to high pressure and high temperature conditions in an appropriate high pressure high temperature (HPHT) system. The HPHT conditions are maintained for a length of time sufficient to dissolve the source gallium nitride and re-precipitate it onto at least one gallium nitride crystal, gallium nitride boule, or gallium nitride crystal seed.

Maintaining HPHT conditions yields large single gallium nitride crystals, for example single gallium nitride crystals having a diameter and thickness in a range from about 0.02 inch (about 0.05 cm) to about 12 inches (about 30 cm), for example a size in a range from about 2 inches to about 6 inches. The pressure, as embodied by the invention, is in a range from greater than about 5 kbar to about 80 kbar, and the temperature for the gallium nitride crystal growth process is in a range between about 550° C. and about 3000° C. The GaN single crystals thus formed are substantially transparent, with an absorption coefficient below 100 cm$^{-1}$. Furthermore, the substrates of the present invention have carrier mobilities above about 100 cm$^2$/V-s and strain, with respect to undoped GaN homoepitaxial layers, below about 0.005%.

The HPHT system is then allowed to cool and the high pressure is relieved. The gallium nitride crystals are removed from the HPHT system and pressure cell and washed in water and mineral acids. The mineral acids for washing the gallium nitride crystals include, but are not limited to, hydrochloric acid (HCl) and nitric acid (HNO$_3$).

The mineralizers, as embodied by the invention, comprise at least one of alkali and alkaline-earth nitrides, such as at least one of Li$_3$N, Mg$_3$N$_2$, and Ca$_3$Na$_2$; amides, such as LiNH$_2$, NaNH$_2$, and KNH$_2$; urea and related compounds, ammonium salts, such as NH$_4$F and NH$_4$Cl; halide, sulfide, and nitrate salts, such as NaCl, CeCl$_3$, Li$_2$S, and KNO$_3$; lithium salts, and combinations thereof The mineralizers may be provided as solids or as additives dissolved in fluids, such as solvents. The use of alkaline-earth or rare-earth mineralizers have the additional advantage of acting as a getter for adventitious oxygen in the growth medium, allowing for the growth of undoped GaN crystals with low n-type carrier density. Alternatively, the mineralizer can be formed in situ. At least one of lithium, sodium, potassium, rubidium, cesium, magnesium, calcium, strontium, barium, or a rare-earth metal may be provided, which then react with the ammonia solvent to form the mineralizer.

The filling and sealing steps will now be described. The capsule is filled with a nitrogen-containing solvent, for example at least one of ammonia or hydrazine or an organic solvent, including, but not limited to methylamine, melamine, or ethylenediamine, without admitting air or water, which are undesirable in the gallium nitride formation process. To fill the capsule without admitting air or water, the capsule is filled and connected to a negative pressure source, such as a vacuum manifold, and evacuated. The capsule is then chilled to a temperature below room temperature (preferably about −72° C. or below) and vapor-phase solvent can be admitted to the manifold. The vapor-phase solvent then condenses in the capsule. For example, if the nitrogen-containing solvent comprises ammonia, the condensation can be performed at dry ice or liquid-nitrogen temperatures.

The capsule can then be isolated so as to seal the capsule by closing a valve to the negative pressure source. The capsule can then be separated from at least one of the manifold or the valve by a pinching-off step using a cold welding apparatus, which is well known in the art. The pinching-off step is particularly effective if the capsule is copper. The integrity of the seal may be enhanced by optional arc-welding.

The capsule and pressure cell comprise any appropriate form that permit the gallium nitride growth process to withstand the high pressure and high temperature as embodied by the invention. The HPHT system that applies the high pressures and high temperatures can comprise a press device, which may include at least one of a die and punch. For example, the press device comprises one of a piston-cylinder press; a belt press; a tetrahedral-, cubic-, or octahedral-anvil press; a recessed-anvil press; and a toriod-type press, each of which are known to those of skill in the art.

The foregoing description of the process for forming the GaN crystal substrate is intended to be illustrative only, and should not be construed in any limiting sense. Other methods for forming the crystal will be obvious to those skilled in the art, but are intended to fall within the scope of the present disclosure.

The GaN crystal formed is of high quality as determined by a measurement of dislocation density. The dislocation density is determined by performing transmission electron microscopy (TEM) on a thin section, as is well known in the art. A GaN crystal of the immediate invention contains less than $10^5$ threading dislocations per cm$^2$, preferably less than $10^3$ dislocations per cm$^2$.

After the crystal has been formed, the substrate for the device fabrication is cut from a boule formed by the method described above. The wafer comprises n-type GaN, with an electrical resistivity less than about 1000 Ω-cm, more preferably less than about 100 Ω-cm, or even more preferably less than about 10 Ω-cm. The substrate is then polished to a mirror finish using mechanical-polishing techniques. These techniques are well known in the art. Subsurface damage may remain after the polishing process. This damage may be removed by several methods that are known in the art, including chemically assisted ion beam etching or chemo-mechanical polishing. The residual damage may also be removed by heating the wafer to a temperature between about 900 and 1500° C. in an atmosphere containing ammonia at a partial pressure between about $10^{-8}$ mbar and 20,000 bar. The substrate preferably has a thickness between about 0.01 and 10 mm, most preferably between about 0.05 and 5 mm.

The wafer used in the present invention is preferably a wurtzite-structure material. Moreover, the (0001)-oriented GaN wafers will have a Ga-terminated (0001) face and an N-terminated (000$\bar{1}$) face. It is expected that the (0001) Ga face will be superior for deposition of LED and LD device structures.

The present invention will be described below in detail with reference to the accompanying drawings. The same reference numerals denote the same parts throughout the drawings.

To begin the device fabrication, the GaN wafer is placed in a growth reactor which is then evacuated. Residual surface defects are annealed, and/or adventitious contaminants removed, by heating the wafer to a temperature between about 900 and 1200° C. in an atmosphere containing ammonia at a partial pressure between about $10^{-6}$ mbar and about 1 bar. The active device structure is fabricated by metalorganic vapor-phase epitaxy (MOVPE) or by molecular beam epitaxy (MBE). These techniques are well known in the art.

With reference to FIG. 1, a detailed schematic illustration of the structure of a homoepitaxial light-emitting diode device 2 representative of the present invention is shown. The GaN wafer 4 is shown as the substrate upon which the device is formed. The device structure 2 is formed by decomposition of organometallic precursors in an ammonia-containing atmosphere on the substrate 4 surface. A carrier gas, such as hydrogen or helium, may be used. Suitable organometallic precursors include trimethylgallium, trimethylaluminum, trimethylindium, and mixtures thereof. Suitable dopant precursors include silane for n-type material, and bis-(cyclopentadienyl) magnesium or dimethyl zinc, for p-type material.

After the substrate 4 has been annealed, as described above, a cladding layer of n-type GaN, $Al_wGa_{1-w}$ N, and mixtures thereof, where $0 \leq w \leq 1$, 6 is optionally formed on the surface of the substrate 4. The n-type GaN and/or $Al_wGa_{1-w}N$ cladding layer 6 has a thickness between about 1 nm and 10 μm, preferably between about 0.1 and 4 μm. The deposition of the n-type GaN and/or $Al_wGa_{1-w}N$ cladding layer 6 may lead to improved electrical properties relative to the substrate itself, a different doping level and electrical conductivity, a higher bandgap, or combinations thereof.

The active layer 8 is then deposited on the optional n-type GaN and/or $Al_wGa_{1-w}N$ 6 or on the substrate 4, in the absence of the n-type GaN and/or $Al_wGa_{1-w}N$ 6 layer. The active layer 8 comprises $In_xGa_{(1-x)}N$, where $0 \leq x \leq 1$. As x varies from 0 to 1, the bandgap varies between 3.4 and 2.0 eV, allowing for light emission between the ultraviolet and amber regions of the electromagnetic spectrum. Typically, x will lie between about 0.025 and 0.6, more particularly between about 0.05 and 0.5. The active layer may be undoped, n-type doped with impurities such as Si or Ge, or p-type doped, with impurities such as Zn or Mg. It may comprise a single layer, as in so-called double heterostructure or single quantum-well structures, or it may consist of a superlattice of $In_xGa_{(1-x)}N$ and $In_yGa_{(1-y)}N$, where $0 \leq y \leq x$, in so-called multiple-quantum well structures. The superlattice will preferably consist of about 1–50 alternating layers of the two different compositions of InGaN, with the more In-rich layers (lower bandgap) comprising the well and the less In-rich layers (higher bandgap) comprising the barrier. Each individual layer may have a thickness between about 0.5 and 50 nm. The well and barrier layers may be undoped, n-type, or p-type doped. The preferred structure comprises undoped well layers, and n-type doped or undoped barrier layers. InN and $In_xGa_{(1-x)}N$ decompose at a temperature lower than does GaN. Therefore, these layers should be deposited at temperatures between about 500 and 1200° C., more preferably between about 650 and 1050° C.

If the active layer is n-type doped, and relatively thick, between about 50 and 500 nm, the LED would be a double-heterostructure device, particularly if the n-type cladding layer 6 comprised $Al_wGa_{(1-w)}N$ rather than GaN. If the active layer is undoped and relatively thin, about 1 to 10 nm, the LED device would be a single quantum well, particularly if an additional n-$Al_wGa_{(1-w)}N$ cladding layer and a n-$In_yGa_{(1-y)}N$ barrier layer, with y<x, were positioned between the n-GaN layer 6 and the active layer 8.

One or more cladding layers are optionally disposed around the active layer 8. As seen in FIG. 1, these cladding layers 10, 12 comprise p-type cladding layers. In FIG. 1, cladding layer 10 comprises $Al_zGa_{(1-z)}N$, wherein $0 \leq z \leq 1$. Cladding layer 12 comprises p-GaN. The cladding layers 10, 12 have the property of a larger bandgap than that of the active layer 8, and are useful for confining the electrical carriers and, in the case of laser diodes, of favorably directing light emission in the desired directions. The cladding layers 6, 10, and 12 are preferably deposited at temperatures between about 600 and 1500° C., more preferably between about 850 and 1200° C.

One common impurity in GaAlInN devices is hydrogen. In the case of p-type material, the hydrogen may complex with acceptor centers and cause the resistivity to be high, degrading device performance. The hydrogen-acceptor complexes may be dissociated in the present invention by annealing at a temperature above about 400° C., or their formation may be avoided in the first place by use of a hydrogen-free growth environment, such as argon, nitrogen, or vacuum. In the absence of hydrogen, the resistivity of the p-type layers should be below about $10^5$ Ω-cm.

In the final step in the formation of the light emitting diode devices of the present invention, metallic contacts 14,16 are formed on the top (p-type) and bottom (n-type) surfaces. Most of the area of the p-type contact 16 is very thin, about 0.001 to about 1 μm thick, so as to be substantially optically transparent. Suitable compositions for the p-type contact 16 include nickel-gold, or at least one metal chosen from Pd, Pt, Au, Al, Sn, In, Cr, Ti, and mixtures thereof. The nickel-gold p-type contact 16 may be alloyed or may contain a nickel-rich composition in contact with the p-GaN layer 12, and a gold-rich composition in contact with the nickel-rich layer.

One suitable composition for the n-type contact 14 is titanium-aluminum. The titanium-aluminum n-type contact 14 may be alloyed or may contain a titanium-rich composition in contact with the n-GaN substrate 4 and an aluminum-rich composition in contact with the titanium-rich layer. Alternatively, the n-type contact 14 may be formed using at least one of Al, Sc, Ti, Zr, Ta, W, Ni, Cu, Ag, Au, Pd, Hf, a rare earth metal, and mixtures thereof. The contacts 14,16 may be deposited by any means known in the art. Preferred methods for the deposition of the metal contacts 14, 16 include sputter-deposition or e-beam evaporation. The metal contacts 14, 16 will perform best as ohmic contacts if annealed to a temperature between about 400 and 1200° C.

Figure 2:
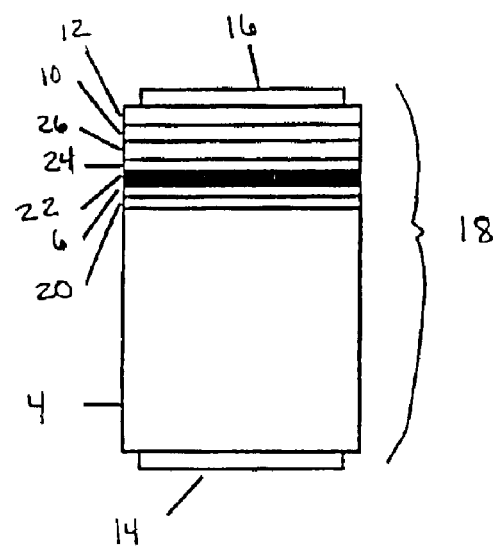
FIG. 2 is a detailed schematic illustration of the structure of a homoepitaxial laser diode device representative of the present invention.

With reference to FIG. 2, a detailed schematic illustration of a structure representative of a homoepitaxial laser diode device 18 of the present invention is shown. The initial steps in the formation of a laser diode device 18 are the same as those of forming the light emitting diode device 2 as described above. FIG. 2 shows a laser diode including many of the optional components discussed with reference to FIG. 1. Specifically, the laser diode 18 comprises a n-GaN substrate 4 upon which the LD semiconductor device is disposed.

The first layer disposed on the n-GaN substrate 4 in FIG. 2 is an optional n-type cladding layer of the structure n-$Al_wGa_{(1-w)}N$ 20, followed by an optional n-GaN cladding layer 6. The active layer depicted in FIG. 2 is an InGaN multiple quantum well layer 22 of the super lattice structure described above. Disposed on the active layer 22 is a series of optional p-type cladding layers 10, 12, 24, and 26. The first p-type cladding layer 24 has a p-$Al_vGa_{(1-v)}N$ structure. The next layer is a p-GaN cladding layer 26, followed by a p-$Al_zGa_{(1-z)}N$ cladding layer 10 and a p-GaN cladding layer 12. To complete the structure for a laser diode, metallic contacts 14, 16 are formed on the top (p-type) and bottom (n-type) surfaces and reflective surfaces are formed along opposing edges to define the laser cavity. A suitable composition for the p-type contact 16 is nickel-gold, either alloyed or with a nickel-rich composition in contact with the p-GaN layer 12 and a gold rich composition in contact with the nickel-rich layer. A suitable composition for the n-type contact 14 is titanium-aluminum, either alloyed or with a titanium-rich composition in contact with the n-GaN substrate 4 and an aluminum-rich composition in contact with the titanium rich layer. The contacts may be deposited by any means known in the art. Preferred methods include sputter-deposition or e-beam evaporation. The contacts will perform best as ohmic contacts if annealed to a temperature between about 400° C. and 1200° C.

The simplest method for forming the reflective surfaces on the edges of the device is to cleave the substrate and device structure, optionally polish, and finally deposit a transparent film on the facets to increase the reflectivity. The device structures should be grown such that the short (facet) dimension is parallel to a ($10\overline{1}0$) plane of the substrate 4. Following the completion of layer deposition, the wafer is cleaved along ($10\overline{1}0$) planes, which are perpendicular to the (0001) growth direction and cleave readily. If desired to improve the surface finish, the facets can be mechanically polished by standard metallographic methods. Finally, the reflectivity can be increased, which will reduce the threshold current for laser action, by application of a transparent reflective layer to each facet. Sputter-deposited $TiO_2/SiO_2$, to a thickness equal to one-quarter of the emission wavelength of the device, constitutes a suitable such coating.

The invention has been described with reference to the preferred embodiment. Obviously, modifications and alterations will occur to others upon reading and understanding the preceding, detailed description. For example, while the detailed description is directed to a vertical device having top and bottom electrical contacts, an insulating or semi-insulating substrate could be used in conjunction with "side" contacts. It is intended that the invention be construed as including all such modifications and alterations insofar as they come within the scope of the appended claims or the equivalents thereof.

We claim:

1. A method for the preparation of a light emitting device comprising:

disposing a group III semiconductor active region on a substrate comprised of GaN having a dislocation density less than $10^5$ cm$^{-2}$.

2. The method of claim 1 wherein deposition of said active region is carried out by metalorganic vapor phase epitaxy.

3. The method of claim 1 wherein deposition of said active region is carried out by molecular beam epitaxy.

4. The method of claim 1 wherein said substrate is annealed at temperatures greater than about 300° C.

5. The method of claim 1 further comprising the deposition of metallic contacts.

6. The method of claim 5 wherein said metallic contacts are chosen from the group consisting of Ni/Au, Ti/Al, Pd, Pt, Au, Ag, Cu, Al, Sn, In, Cr, Ti, Sc, Zr, Ta, W, Ni, Hf, a rare earth metal, and mixtures thereof.

7. The method of claim 1 further comprising the deposition of cladding layers chosen from the group consisting of n-GaN, n-$Al_w Ga_{(1-w)}N$, p-$Al_y Ga_{1-y}N$, p-GaN, and mixtures thereof, wherein $0 \leq w, y \leq 1$.

8. The method of claim 1 further comprising forming metallic contacts on a top (p-type) and bottom (n-type) surfaces and reflective surfaces along opposing edges to form a laser diode.

9. The method of claim 8 wherein a short dimension is parallel to a (10 $\bar{1}$ 0) plane of the substrate and the reflective faces are formed by cleaving.

10. The method of claim 8, further comprising deposition of a transparent, reflective layer on each facet.

11. A method for the preparation of a light emitting device comprising forming a group III semiconductor active region on a substrate comprised of GaN, wherein said substrate is cut from a boule that has been prepared from a GaN crystal formed by precipitation onto a gallium nitride crystal seed or boule.

12. The method of claim 11 wherein said boule is grown in a supercritical solvent at a temperature above about 550° C. at a pressure above about 5 kbar.

13. The method of claim 11 wherein said boule is grown from source gallium nitride selected from the group consisting of poorly-crystallized gallium nitride, well-crystallized gallium nitride, amorphous gallium nitride, gallium metal, polycrystalline gallium nitride, and mixtures thereof.

14. The method of claim 11 wherein said substrate is a single crystal.

15. The method of claim 11 wherein said boule is grown in nitrogen-containing solvent.

16. The method of claim 15 wherein said boule is grown in the pressure of a mineralizer.

17. The method of claim 11 further comprising the deposition of cladding layers chosen from the group consisting of n-GaN, n-$Al_w Ga_{(1-w)}N$, p-$Al_y Ga_{(1-y)}$ N, p-GaN, and mixtures thereof, wherein $0 \leq w, y \leq 1$.

18. The method of claim 11 further comprising forming metallic contacts on top (p-type) and bottom (n-type) surfaces and reflective surfaces along opposing edges to form a laser diode.

19. The method of claim 18 wherein a short dimension is parallel to a (10 $\bar{1}$ 0) plane of the substrate and the reflective faces are formed by cleaving.

20. The method of claim 18, further comprising deposition of a transparent, reflective layer on each facet.

21. A method for forming a light emitting device comprising forming a light emitting region on a GaN substrate, said GaN substrate being formed by precipitating GaN onto a gallium nitride crystal seed.

22. The method of claim 21 wherein said substrate is a single crystal.

23. The method of claim 22 wherein said precipitating is conducted at a temperature above about 550° C.

24. The method of claim 23 wherein said precipitating is conducted at a pressure above about 5 kbar.

25. The method of claim 24 wherein said precipitating is conducted in a supercritical solvent.

26. The method of claim 21 further comprising the step of forming a boule as a result of said precipitating.

27. The method of claim 26 wherein said substrate is cut from said boule.

28. The method of claim 21 wherein said substrate has an absorption coefficient below about 100 $cm^{-2}$.

29. The method of claim 21 wherein said substrate has strain below about 0.005%.

30. The method of claim 21 wherein said substrate has a thickness between about 0.05 and 5 mm.

31. The method of claim 1, wherein the GaN substrate has a dislocation density less than 100 $cm^{-2}$.

32. The method of claim 1, wherein the GaN substrate has a carrier mobility above about 100 $cm^2/V$-s.

33. The method of claim 1, wherein the GaN substrate has a dislocation density less than $10^3$ $cm^{-2}$.

* * * * *